(12) United States Patent  
Lin et al.

(10) Patent No.: US 9,087,881 B2
(45) Date of Patent: Jul. 21, 2015

(54) ELECTROLESS FILL OF TRENCH IN SEMICONDUCTOR STRUCTURE

(71) Applicant: GLOBALFOUNDRIES Inc., Grand Cayman (KY)

(72) Inventors: Sean X. Lin, Watervliet, NY (US); Xunyuan Zhang, Albany, NY (US); Ming He, Slingerlands, NY (US); Larry Zhao, Niskayuna, NY (US); John Iacoponi, Saratoga Springs, NY (US); Kunaljeet Tanwar, Slingerlands, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 74 days.

(21) Appl. No.: 13/785,934

(22) Filed: Mar. 5, 2013

(65) Prior Publication Data

US 2014/0252616 A1 Sep. 11, 2014

(51) Int. Cl.
*H01L 21/768* (2006.01)
*H01L 23/48* (2006.01)

(52) U.S. Cl.
CPC .......... *H01L 21/76847* (2013.01); *H01L 23/48* (2013.01); *H01L 2924/0002* (2013.01)

(58) Field of Classification Search
CPC ............... H01L 21/76843; H01L 21/76877; H01L 21/76873; H01L 21/28556
USPC ........ 257/E21.584, E21.585, E586, E21.082, 257/E21.295; 438/637, 643, 650
See application file for complete search history.

(56) References Cited

U.S. PATENT DOCUMENTS

| 6,423,200 | B1 | 7/2002 | Hymes |
| 7,884,012 | B2 | 2/2011 | Suzuki et al. |
| 2007/0293039 | A1* | 12/2007 | Bu et al. ................... 438/627 |
| 2010/0285660 | A1* | 11/2010 | Lin et al. .................. 438/650 |
| 2011/0195570 | A1* | 8/2011 | Lin et al. .................. 438/652 |
| 2011/0266676 | A1* | 11/2011 | Isobayashi .................. 257/751 |

\* cited by examiner

*Primary Examiner* — David Vu
*Assistant Examiner* — Jonathan Han
(74) *Attorney, Agent, or Firm* — Wayne F. Reinke, Esq.; Heslin Rothenberg Farley & Mesiti P.C.

(57) ABSTRACT

A trench in an inter-layer dielectric formed on a semiconductor substrate is defined by a bottom and sidewalls. A copper barrier lines the trench with a copper-growth-promoting liner over the barrier. The trench has bulk copper filling it, and includes voids in the copper. The copper with voids is removed, including from the sidewalls, leaving a void-free copper portion at the bottom. Immersion in an electroless copper bath promotes upward growth of copper on top of the void-free copper portion without inward sidewall copper growth, resulting in a void-free copper fill of the trench.

12 Claims, 2 Drawing Sheets

ELECTROLESS FILL OF TRENCH IN SEMICONDUCTOR STRUCTURE

BACKGROUND OF THE INVENTION

1. Technical Field

The present invention generally relates to reducing defects and improving conductivity of copper and copper alloy interconnection patterns in semiconductor devices. More particularly, the present invention relates to filling trenches or vias in semiconductor fabrication with bulk copper metal while minimizing or eliminating void formation in the copper.

2. Background Information

The fabrication of advanced integrated circuits, such as CPU's, storage devices, ASIC's (application specific integrated circuits) and the like, requires the formation of a large number of circuit elements in a given chip area according to a specified circuit layout. Field effect transistors (FET's), for example, NMOS and PMOS transistors, represent one important type of circuit element that, to a great extent, substantially determines the performance capability of integrated circuit devices employing such transistors. A field effect transistor, irrespective of whether an NMOS transistor or a PMOS transistor is considered, typically includes so-called PN junctions that are formed by an interface of highly doped regions, referred to as drain and source regions, with a slightly doped or non-doped region, such as a channel region, disposed between the highly doped source/drain regions.

However, the on-going shrinkage of feature sizes on transistor devices causes certain problems that may at least partially offset the advantages that may be obtained by reduction of the device features. Generally, decreasing the size of, for instance, the channel length of a transistor typically results in higher drive current capabilities and enhanced switching speeds. Upon decreasing channel length, however, the pitch between adjacent transistors likewise decreases, thereby limiting the size of the conductive contact elements—e.g., those elements that provide electrical connection to the transistor, such as contact vias and the like—that may fit within the available real estate between adjacent transistors. Accordingly, the electrical resistance of conductive contact elements becomes a significant issue in the overall transistor design, since the cross-sectional area of these elements is correspondingly decreased. Moreover, the cross-sectional area of the contact vias, together with the characteristics of the materials they include, may have a significant influence on the effective electrical resistance and overall performance of these circuit elements.

Thus, improving the functionality and performance capability of various metallization systems has become important in designing modern semiconductor devices. One example of such improvements is the enhanced use of copper metallization systems in integrated circuit devices and the use of so-called "low-k" dielectric materials, i.e., materials having a dielectric constant of less than 3.9 in such devices. Copper metallization systems exhibit improved electrical conductivity as compared to, for example, prior art metallization systems using aluminum for the conductive lines and vias. The use of low-k dielectric materials also tends to improve the signal-to-noise ratio (S/N ratio) by reducing crosstalk as compared to other dielectric materials with higher dielectric constants. However, the use of such low-k dielectric material can be problematic as they tend to be less resistant to metal migration as compared to some other dielectric materials.

Copper is a material that is difficult to etch using traditional masking and etching techniques. Thus, conductive copper structures, e.g., conductive lines or vias, in modern integrated circuit devices are typically formed using known single or dual damascene techniques. In general, the damascene technique involves forming a trench/via in a layer of insulating material, depositing one or more relatively thin barrier layers, forming copper material across the substrate and in the trench/via and performing a chemical mechanical polishing process to remove the excess portions of the copper material and the barrier layer positioned outside of the trench/via to define the final conductive copper structure. The copper material is typically formed using an electrochemical copper deposition process after a thin conductive copper seed layer is deposited by physical vapor deposition on a barrier layer.

An electroplating process is performed to deposit an appropriate amount of bulk copper, e.g. a layer of copper about 500 nm or so thick, across the substrate in an attempt to insure that the trench/via is completely filled with copper. In an electroplating process, electrodes are coupled to the copper seed layer at the perimeter of the substrate and a current is passed through the copper seed layer which causes copper material to deposit and build on the copper seed layer.

As noted above, as device dimensions have continued to shrink, the size of the conductive structures has also decreased. As a result, the dimensions of the trench/via have become relatively small making it a challenge to reliably fill such high-aspect ratio openings with very small openings at the top. As the electroplating process proceeds, the copper material may tend to "pinch-off" the trench opening thereby leading to the formation of voids in the bulk copper. One reason pinch-off occurs is that the deposition of copper in an electroplating process typically occurs in many directions, i.e., from all copper seed surfaces, although the rate at which copper deposits may be greater on some surfaces than others. For example, more copper may deposit on the bottom of a trench as compared to the amount of copper deposited on the sidewall of the trench. Thus, formation of copper material on the copper seed layer positioned on the sidewalls of the trench/via tends to contribute, to at least some degree, to the "pinch-off" problem.

Thus, there is a need to reduce the occurrence of voids in bulk copper filling trenches or vias, and, hence, defects, in semiconductor devices.

SUMMARY OF THE INVENTION

The shortcomings of the prior art are overcome and additional advantages are provided through the provision, in one aspect, of a method of filling trenches or vias with bulk copper metal in semiconductor fabrication while reducing or eliminating void formation in the copper. The method includes providing a semiconductor structure including a copper-filled trench in a layer of an insulating material, the trench being defined by a bottom and walls, and the copper having one or more undesired voids therein. The method further includes removing a portion of the copper from the trench, the portion including the one or more voids and including less than all of the copper in the trench, and electrolessly filling the trench from the bottom upward with additional copper while avoiding copper growth inward from the walls. The electrolessly filling includes placing the semiconductor structure into an electroless copper solution, and the growing includes copper from the solution growing on the predetermined amount of copper.

In accordance with another aspect, a semiconductor structure is provided that includes a copper-filled trench in a layer of a dielectric, the copper having an absence of voids therein.

These, and other objects, features and advantages of this invention will become apparent from the following detailed

DETAILED DESCRIPTION OF THE INVENTION

Figure 1:
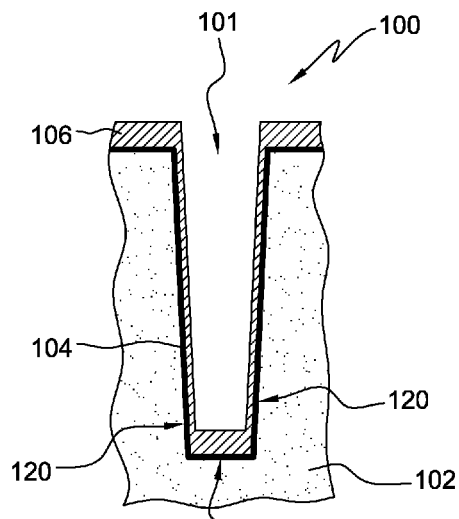
FIG. 1 is a cross-sectional view of one example of an intermediate semiconductor structure having a trench in a dielectric layer.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, such as additional fabrication steps and/or additional layers of materials, and/or different arrangements of certain disclosed layers, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 depicts a cross-section of one example of a semiconductor structure 100, including trench 101, patterned into a dielectric material 102. Although described with respect to a trench in this example, it will be understood that the method of the invention is applicable to other features in a semiconductor structure, effectively having walls and a bottom, so as to hold copper, such as, for example, vias and the like. Thus, the term "trench" includes such other features. The dielectric material may include, for example, oxides, nitrides or oxynitrides, silicon dioxide ($SiO_2$), silicon nitride (SiN) or silicon oxynitride (SiON), or otherwise a low dielectric constant ("low k") material having a dielectric constant less than about that of $SiO_2$ (k=3.9). Common low k materials include simple or complex compounds of Si, O, N, C, H or halogens, either as dense or porous materials for example, BCB (divinylsiloxane bisbenzocyclobutene), and silicon-carbon-oxygen-hydrogen (SiCOH) organic dielectrics. The dielectric material 102 may be deposited using conventional deposition processes, such as, for example, chemical vapor deposition (CVD), atomic layer deposition (ALD), evaporation, sputtering or solution based techniques, such as spin-on coating.

Since copper has poor adhesion to the dielectric materials and can diffuse into the dielectric materials, a conventional barrier layer 104 of about 0.5 nm to about 10 nm thick may be deposited on the dielectric material to prohibit or minimize the diffusion of copper into the dielectric material 102, by using conventional deposition processes, such as, for example, physical vapor deposition (PVD), chemical vapor deposition (CVD), pulsed CVD, plasma-enhanced CVD (PECVD), atomic layer deposition (ALD), plasma-enhanced ALD (PEALD) or sputtering methods. The thickness of the barrier layer 104 may be about 0.5 nanometers to about 10 nanometers and the materials may include, for example, tantalum based materials (e.g., TaN, TaC, TaCN, TaSiN), titanium based materials (e.g., TiN, TiC, TiCN, TiSiN), tungsten based materials (e.g., WN, WC, WCN) or a combination thereof. In a specific example, tantalum nitride may be formed by sequentially exposing the substrate to pentakis (dimethylamino) tantalum (PDMAT) and ammonia during an ALD process or a PE-ALD process.

A liner material 106 for bonding with copper (also known as "adhesive liner") may be deposited over the barrier layer 104 using conventional techniques such as, for example, atomic layer deposition (ALD), chemical vapor deposition (CVD), physical vapor deposition (PVD). In a preferred embodiment, the thickness of the liner 106 may be about 0.5 nanometers to about 10 nanometers. Although the materials for the adhesive liner such as ruthenium (Ru), an alloy of ruthenium, cobalt (Co), an alloy of cobalt, titanium (Ti), an alloy of titanium, tungsten (W), an alloy of tungsten, tantalum (Ta) or an alloy of tantalum, palladium (Pd), rhodium (Rh) or silver (Ag) may be used, ruthenium or an alloy of ruthenium are preferred because of the stronger bonding properties of ruthenium with copper. In a specific example, a ruthenium layer may be deposited by sequentially exposing the substrate to a ruthenium metalorganic precursor, such as, for example, (2,4-dimethylpentadienyl) (ethylcyclopentadienyl) ruthenium (Ru(DMPD) (EtCp)) and a reactant during a CVD, ALD or PE-ALD process.

Figure 2:
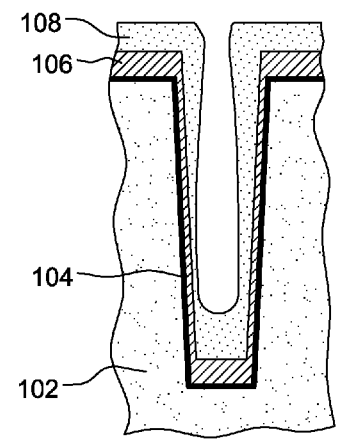
FIG. 2 depicts the intermediate structure of FIG. 1 after the deposition of an optional copper seed layer, in accordance with one or more aspect of the present invention.

Optionally, as depicted in FIG. 2, a smooth copper metal seed layer 108, of a thickness of about 1 nanometer to about 50 nanometers, may be deposited over the adhesive liner 106, for a subsequent copper electroplating process, using conventional deposition processes, such as an electrochemical plating (ECP) process or a PVD process.

Figure 3:
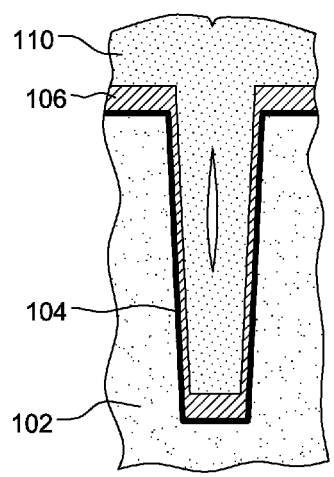
FIG. 3 depicts the intermediate structure of FIG. 2 after deposition of bulk copper in the trench, in accordance with one or more aspects of the present invention.

A bulk layer of copper 110 is then deposited, as depicted in FIG. 3, using conventional copper deposition methods such as, for example, electrochemical plating, copper physical vapor deposition method, or a copper dry reflow process. The voids embedded inside the copper are removed in a subsequent etching step, in accordance with aspects of the present invention. This deposition results in the trench being overfilled with copper. Where copper electroplating is used, cathodic current is passed on the conductive copper seed layer or liner layer so the copper ions in the plating solution are deposited on the wafer surface as copper metal. Alternatively, the feature can be filled by copper dry reflow process that deposits a thin layer of copper by PVD or plating, then the copper layer is exposed to a thermal treatment that causes a portion of copper on the bulk field to migrate into the feature areas. The steps are repeated a few times until the pattern trenches or vias are completely filled.

Figure 4:
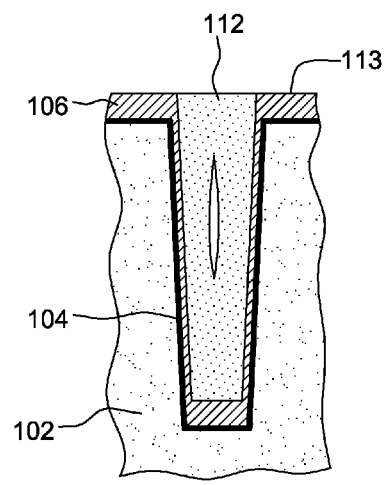
FIG. 4 depicts the intermediate structure of FIG. 3 after planarization of the copper over-fill, in accordance with one or more aspects of the present invention.

As illustrated in FIG. 4, the excess copper is removed using, for example, chemical-mechanical polishing (CMP), stopping at the liner, barrier or the dielectric layer. The result is that the exposed surface 112 of the copper is substantially coplanar with the exposed upper surface 113 of the adhesive liner, barrier or dielectric material.

Figure 5:
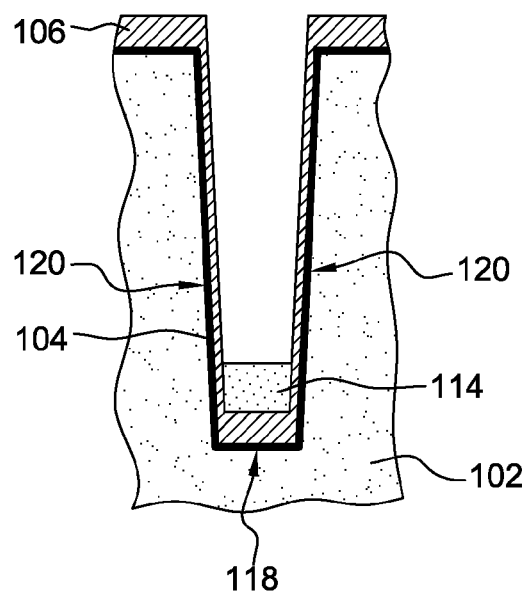
FIG. 5 depicts the intermediate structure of FIG. 4 after the controlled anisotropic etching of the copper, in accordance with one or more aspects of the present invention.

As depicted in FIG. 5, the exposed upper surface of the copper is etched back, preferably using a controlled wet etching process, to remove a portion of the copper from the sidewalls (i.e., from the liner 106 lining sidewalls 120), while leaving a predetermined amount of copper 114 on the bottom of the recess (i.e., on the liner 106 lining the bottom 118) to initiate electroless copper growth upwards from the bottom. The conventional wet etch process may be performed using a variety of alkaline, acidic, oxidizer or mixtures thereof. Examples of neutral or alkaline etchants include ammonium or alkali metal persulfate solutions, ferric chloride based solutions, and ammonium hydroxide based solutions that may be used for the anisotropic wet etch process. The acidic copper etchants may include, for example, hydrochloric acid or hydrogen peroxide-acid mixture. Another example of wet recess is to oxidize the exposed copper (by ammonium hydroxide and peroxide mixture, for example), followed by acid treatment to dissolve the copper oxide (by diluted citric acid, for example). The predetermined amount of copper 114 on the bottom of the recess may be determined to be about 1 nanometer to about 20 nanometers, and may easily be calculated accurately depending on the depth of the recess and the etch rate of the wet chemicals used. As the anisotropic wet etch process progresses from the top of the recessed feature toward the bottom, the copper portion with the voids is removed from within the recessed feature, leaving the residual bottom copper that is free of voids, since pinch-off does not begin until after the predetermined amount of copper has been deposited.

Figure 6:
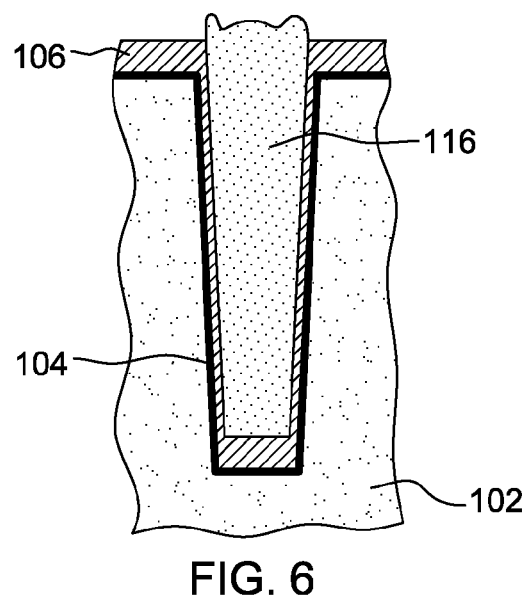
FIG. 6 depicts the resultant structure obtained after the electroless deposition of copper, in accordance with one or more aspects of the present invention.

A bulk layer of copper 116 is deposited in the trench, as depicted in FIG. 6, over the predetermined amount of copper during a bottom-up, electroless deposition process. A "bottom-up" process or "bottom up" fill is used herein to describe the deposition or the formation of a metal on the bottom of an opening, a via or an aperture within a substrate and the continued process of depositing or forming metal from the bottom of the trench up to the top of the opening. A bottom-up fill forms no material or substantially no material on the sidewalls of the trench prior to the metal reaching that point in the trench. As a result, there is no competitive sidewall or top-down growth of copper in the trench, substantially reducing or eliminating the possibility of pinch-off and leading to a substantially or completely void free fill of the feature with bulk copper. The electroless deposition of copper may be performed using conventional techniques, for example, where the structure is immersed into an aqueous electroless copper bath. One example of such an electroless bath includes a copper source, copper complexing agent, reducing agent, inhibitor, optional additives and a pH adjusting agent. The deposition rate and deposit properties of the electroless copper deposition depend on variables such as agitation, the copper complexing agent, reducing agent, bath temperature and pH.

In a typical example, a copper source is contained within the electroless copper solution and provides dissolved copper ions (e.g., $Cu^{2+}$ or $Cu^{+}$) that may be reductively plated or deposited onto the surface as metallic copper. The copper source includes water soluble copper precursors such as, copper sulfate ($CuSO_4$), copper chloride ($CuCl_2$), copper acetate (($CH_3CO_2)_2Cu$), copper acetylacetonate (($C_5H_7O_2)_2Cu$), derivatives thereof, hydrates thereof or combinations thereof. The electroless copper solution has at least one complexing agent or chelator to form complexes with copper ions while providing stability and control during the deposition process. Typically, the complexing agent may have functional groups such as carboxylic acids, dicarboxylic acids, polycarboxylic acids, amino acids, amines, diamines or polyamines. Specific examples of complexing agents may include ethylene diamine tetraacetic acid (EDTA), ethylene diamine (EDA), citric acid, citrates, glyoxylates, glycine, amino acids, derivatives thereof, salts thereof or combinations thereof.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
   providing a semiconductor structure comprising a copper-filled trench in a layer of an insulating material, wherein the trench is defined by a bottom and walls, and wherein the copper has one or more undesired voids therein;
   removing a portion of the copper from the trench, the portion including the one or more voids and comprising less than all of the copper in the trench; and
   electrolessly filling the trench from the bottom upward with additional copper while avoiding copper growth inward from the walls, wherein the electrolessly filling comprises placing the semiconductor structure into an electroless copper solution, and wherein the growing comprises copper from the solution growing on a remaining amount of copper after the removing.

2. The method of claim 1, wherein the removing comprises performing a chemical etch of the copper in the trench.

3. The method of claim 1, wherein an amount of copper remaining in the trench after the removing comprises from about 1 nm to about 20 nm.

4. The method of claim 1, wherein the electrolessly filling comprises placing the semiconductor structure into an electroless copper solution.

5. The method of claim 1, further comprising planarizing the additional copper after tilling the trench.

6. The method of claim 1, wherein, the removing comprises leaving a predetermined amount of the copper at the bottom of the trench, and wherein the electrolessly filling comprises growing the additional copper on top of the predetermined amount.

7. The method of claim 1, wherein the insulating material comprises a silicon oxide-based dielectric.

8. The method of claim 1, wherein the trench comprises a barrier on the bottom and walls to prevent copper diffusion into the insulating layer.

9. The method of claim 8, wherein the barrier comprises at least one of tantalum, titanium and tungsten.

10. The method of claim 8, wherein the trench further comprises a liner on the barrier to promote copper growth.

11. The method of claim 10, wherein the liner comprises at least one of ruthenium, a ruthenium alloy, cobalt, a cobalt alloy, titanium, a titanium alloy, tungsten, a tungsten alloy, tantalum and a tantalum alloy.

12. A method, comprising:
providing a semiconductor structure comprising a copper-filled trench in a layer of an insulating material, wherein the trench is defined by a bottom and walls, and wherein the copper has one or more undesired voids therein;
removing a portion of the copper from the trench, the portion including the one or more voids and comprising less than all of the copper in the trench; and
electrolessly filling the trench from the bottom upward with additional copper while avoiding copper growth inward from the walls, wherein the electrolessly filling comprises placing the semiconductor structure into an electroless copper solution, and wherein the growing comprises copper from the solution growing on a remaining amount of copper after the removing;
wherein the removing and the electrolessly filling result in a semiconductor structure with a copper-filled trench in the layer of insulating material, the copper having an absence of voids therein.

* * * * *

UNITED STATES PATENT AND TRADEMARK OFFICE
CERTIFICATE OF CORRECTION

Page 1 of 1

PATENT NO. : 9,087,881 B2
APPLICATION NO. : 13/785934
DATED : July 21, 2015
INVENTOR(S) : Lin et al.

It is certified that error appears in the above-identified patent and that said Letters Patent is hereby corrected as shown below:

In the claims

Column 6, Line 58: Claim 1, Delete "wails" and insert --walls--

Signed and Sealed this
First Day of December, 2015

Michelle K. Lee
*Director of the United States Patent and Trademark Office*